United States Patent [19]

Naito et al.

[11] 4,033,291

[45] July 5, 1977

[54] APPARATUS FOR LIQUID-PHASE EPITAXIAL GROWTH

[75] Inventors: Makoto Naito, Kamakura; Masaru Kawachi, Tokyo; Tetuo Sekiwa, Kawasaki; Minoru Akatsuka, Yokohama; Akinobu Kasami, Yokohama; Masaharu Toyama, Kawasaki, all of Japan

[73] Assignee: Tokyo Shibaura Electric Co., Ltd., Kawasaki, Japan

[22] Filed: July 10, 1975

[21] Appl. No.: 594,950

Related U.S. Application Data

[63] Continuation of Ser. No. 361,543, May 18, 1973, abandoned.

[30] Foreign Application Priority Data

Mar. 9, 1973  Japan ............................... 48-27127

[52] U.S. Cl. .......................... 118/412; 118/415; 156/622
[51] Int. Cl.² ........................................ B05C 3/09
[58] Field of Search .............. 118/415, 412, 422; 148/171; 432/264, 265; 23/273 SP; 156/622

[56] References Cited

UNITED STATES PATENTS

| | | | |
|---|---|---|---|
| 3,665,888 | 5/1972 | Bergh et al. | 118/415 X |
| 3,753,801 | 8/1973 | Lockwood et al. | 118/415 X |
| 3,759,759 | 9/1973 | Solomon | 118/415 X |
| 3,785,884 | 1/1974 | Lockwood | 118/415 X |

Primary Examiner—John P. McIntosh
Attorney, Agent, or Firm—Carroll F. Palmer

[57] ABSTRACT

An apparatus for liquid-phase epitaxial growth is characterized in that the greater part of that surface of a well, made of carbon, which contacts with a solution for liquid-phase epitaxial growth is covered with a fused quartz layer.

8 Claims, 5 Drawing Figures

APPARATUS FOR LIQUID-PHASE EPITAXIAL GROWTH

This is a continuation, of application Ser. No. 361,543, filed May 18, 1973, now abandoned.

BACKGROUND OF THE INVENTION

This invention relates to an apparatus for liquid-phase epitaxial growth.

With conventional apparatus for liquid-phase epitaxial growth, material is dissolved within the apparatus to form a solution for liquid-phase epitaxial growth. The solution is then caused to contact a substrate to form a liquid-phase epitaxial layer on the substrate.

The apparatus of such type is disclosed in U.S. Pat. No. 3551219. In the U.S. Pat. No. 3551219 a well for receiving a solution for liquid-phase epitaxial growth is shown as made of carbon only. With apparatus provided with such carbon well, however, it was very difficult to obtain a liquid-phase epitaxial growth layer having a desired profile of impurity concentration, particularly a liquid-phase epitaxial growth layer having a lower impurity concentration. The latter case means that it is impossible to obtain, in a case of a light-emitting diode for example, light-emitting diodes showing a good luminous efficiency.

Light-emitting diodes were manufactured using an apparatus whose well for receiving a solution for liquid-phase epitaxial growth is made of carbon only. The luminous efficiency was found to be of the order of 0.1–0.8%.

Likewise, light-emitting diodes were manufactured using an apparatus whose well for receiving a solution for liquid-phase epitaxial growth is made of fused guartz only. The luminous efficiency was found to be of the order of 0.3–1%.

SUMMARY OF THE INVENTION

An object of this invention is to provide an apparatus capable of forming a liguid-phase epitaxial crystal layer having low impurity concentration.

Another object of this invention is to provide an apparatus capable of obtaining a liquid-phase epitaxial crystal layer having a predetermined impurity concentration and a predetermined thickness with a good reproducibility or repeatability.

Still another object of this invention is to provide an apparatus capable of obtaining a light emitting diode exhibiting a high luminous efficiency with a good reproducibility.

This invention provides apparatus for liquid-phase epitaxial growth, made of carbon, in which the greater part of that suface of a well for receiving a solution for liquid-phase epitaxial growth which contacts with a solution for liquid-phase epitaxial growth is covered with a fused quartz layer. The thickness of the above fused quartz layer is desirably in a range of 0.3–2mm.

DETAILED DESCRIPTION OF THE INVENTION

Figure 1:
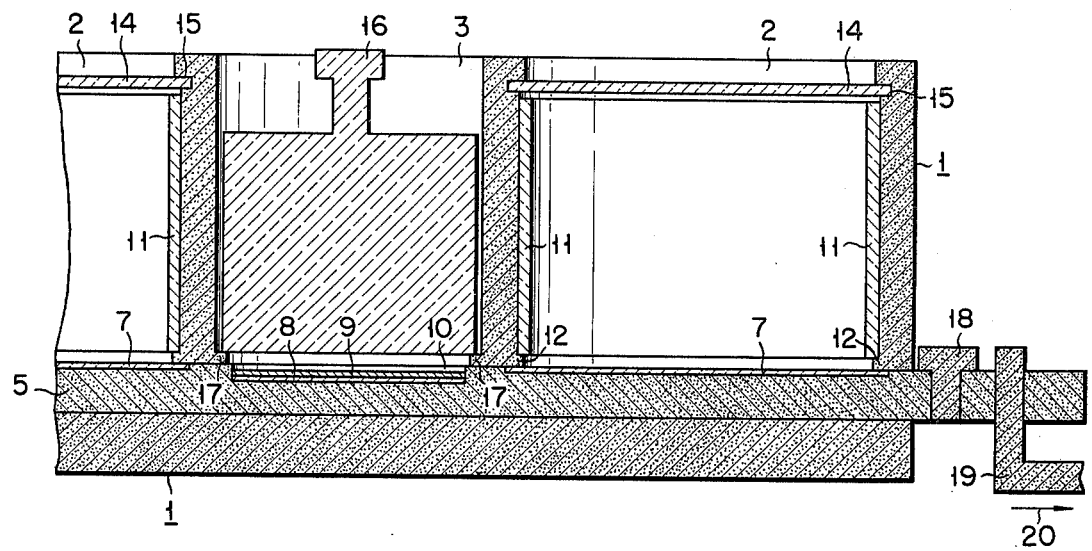
FIG. 1 is a longitudinal cross section of one embodiment of an apparatus according to this invention.
Figure 2:
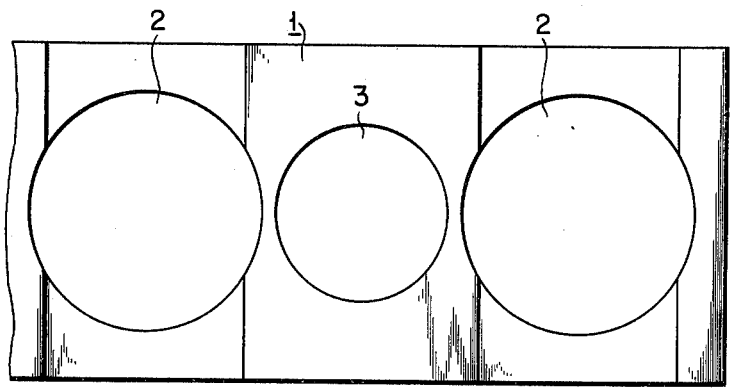
FIG. 2 is a plan view, partly broken away, showing the apparatus of this invention.
Figure 3:
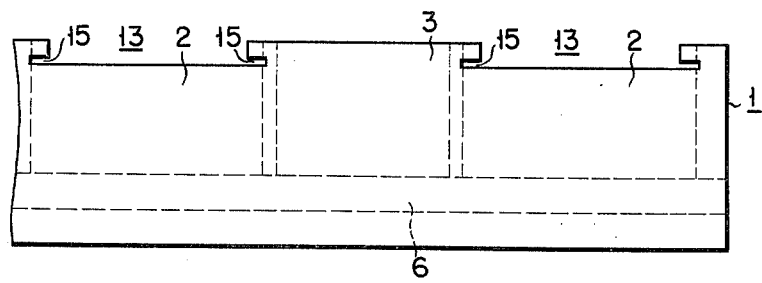
FIG. 3 is a front view of FIG. 2.
Figure 4:
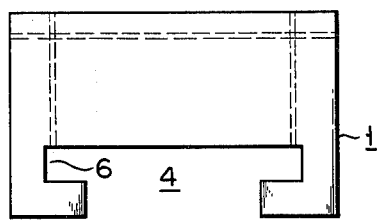
FIG. 4 is an end view of FIG. 2.
Figure 5:
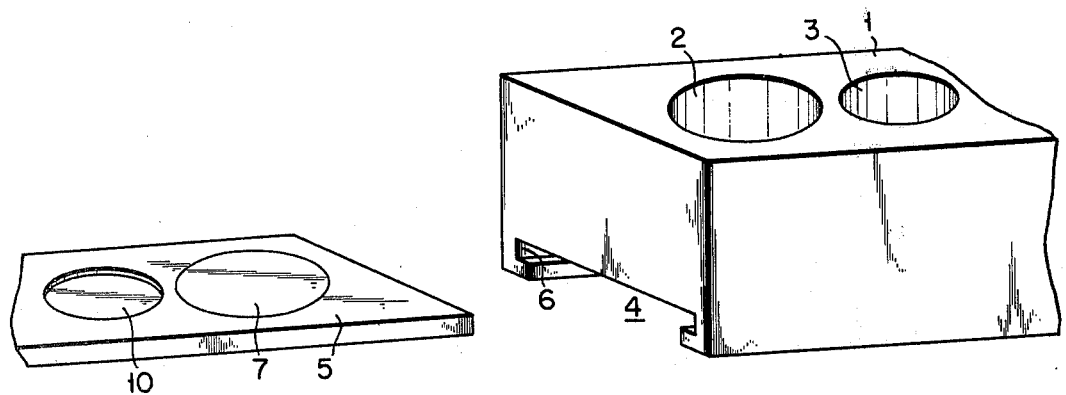
FIG. 5 is a perspective view showing a relation between an apparatus body and a bottom plate slidably engageable with the apparatus body.

There will now be described one embodiment of this invention as applied to light-emitting diode manufacturing apparatus.

A body 1 of the apparatus constitutes a quadratic prism of 60mm × 600mm × 40mm made of a synthetic graphite having a density of, preferably, 1.75 g/cc. In the apparatus body 1 are alternatively provided through bores 2 of 40mm $\phi$ defining the side wall of a well or a chamber for receiving a solution for liquid-phase epitaxial growth, and substrate inserting holes 3 of 30mm $\phi$ defining the side wall of a substrate inserting well or chamber. Into slide grooves 6 provided at the base portion of the apparatus body 1 is slidably inserted a substrate supporting plate 5 constituting the bottom 4 of the apparatus body.

In FIG. 1 is shown the substrate supporting plate 5 slidably inserted into the slide grooves 6 of the apparatus body. In that surface portion of the substrate supporting plate 5 substantially corresponding to the bottom of the through bore 2, a fused quartz disc 7 of 1mm in thickness is embedded flush with the top surface of the substrate supporting plate 5. That is, the fused quartz disc 7 constitutes the bottom portion of the well for receiving a solution for liquid-phase epitaxial growth. In that surface portion of the substrate supporting plate 5 substantially corresponding to the bottom of the substrate inserting hole 3 is provided a circular recess 10 into which a fused quartz disc 8 and a substrate 9, a GaP substrate for example, are located in such order. Into the side wall portion of the through bore 2, a fused quartz cylinder 11 of 1mm in thickness is fitted to substantially cover the side wall surface of the through bore 2. At the lower end portion of the through bore 2, an annular stopper or flange 12 is provided integral with the side wall of the bore 2 to prevent a drop down of the fused quartz cylinder 11 into the slide groove 6. The annular stopper is 1mm in height and 0.5mm in width. In the upper surface portion of the bore 2 an upper groove 15 is provided. Into the upper groove 15 is slidably engaged a fused quartz plate 14 constituting a top covering of the well for receiving a solution for liquid-phase epitaxial growth. A weight covering 16 made of fused quartz is disposed into the hole 3 in a manner to permit it to be inserted into and out of the hole 3. At the lower end portion of the hole 3, an annular stopper or flange 17 is provided integral with the side wall of the hole 3 to prevent the weight covering 16 from falling down into the slide groove 6.

In the neighborhood of one end of the substrate supporting plate 5 a positioning stopper 18 is provided to permit, upon insertion of the substrate supporting plate 5 into the slide groove 6, the bore 2 and the hole 3 to be located in a manner to substantially align with the fused quartz disc 7 and the substrate 9, respectively.

A handle 19 is mounted at the end portion of the substrate supporting plate 5. A slide control is afforded by applying a force on the handle 19.

As will be evident from the above structure of the apparatus, the well for receiving a solution for liquid-phase epitaxial growth which consists of the bore 2 and the substrate supporting plate 5, that is, that surface portion of the well contacting with a solution for liquid-phase epitaxial growth, is covered with the fused quartz cylinder 11 and the fused quartz disc 7.

Explanation will now be made of the operation of the apparatus of this invention by referring to the manufacture of a GaP photoemission diode.

The substrate supporting plate 5 is inserted into the slide grooves 6 provided at the base portion 4 of the apparatus body 1 and is located by the positioning stopper 18. In a position so located, the fused quartz plate 7 is located in that surface portion of the substrate supporting plate 5 substantially corresponding to the bottom portion of a well for receiving a solution for liquid-phase epitaxial growth.

Then, 20g of gallium, 1.4g of GaP and 0.5g of $Ga_2O_3$ are introduced, as a material for liquid-phase epitaxial growth, together with 5mg of Te as an n-type impurity, and the well is slid shut by slidably inserting the fused quartz plate 14 constituting the top of the well.

Then, the weight covering 16 made of fused quartz is taken out from the substrate inserting hole 3, and an n-type GaP substrate 9 of 0.35mm in thickness is positioned on each of the fused quartz plates 8 embedded in the circular recess 10 of the substrate supporting plate 5. The weight covering 16 is again inserted into the hole 3.

The apparatus is then placed in a heating furnace (not shown) capable of heating the epitaxial material to a melting temperature, 1050° C for example, to cause a solution for liquid-phase epitaxial growth to be produced. It will be understood that the greater part of the solution so produced contacts with the thin fused quartz layer, not directly with the synthetic graphite wall of the apparatus body.

Heat from the heating furnace is conducted through the synthetic graphite apparatus body 1, effectively into the liquid-phase epitaxial material. The thin fused quartz layer prevents impurities from intruding, from outside, into the well for receiving a solution for liquid-phase epitaxial growth, as well as prevents an escape of vapor evaporated from the solution of liquid-phase epitaxial growth. The fused quartz weight covering 16 protects the substrate surface from being deteriorated due to the decomposition and sublimation of phosphorus (P) constituting one component of the GaP substrate 9. Therefore, the smaller a space defined between the bottom surface of the fused quartz weight covering 16 and the surface of the substrate 9, the better. For example, the space may be 1mm.

After such steps, the substrate 9 is set in a position to substantially align with the bore 2 by drawing the handle 19, in a direction indicated by an arrow 20, from outside the heating furnace (not shown). Then, the temperature in the heating furnace is lowered with a temperature gradient necessary for liquid-phase epitaxial growth and an n-type liquid-phase epitaxial growth layer is formed onto the substrate. It is desirable that the height of the stopper 12 for supporting the lower end of the fused quartz cylinder 11 be made as low as possible. The height of the stopper may be, for example, 1mm.

The impurity concentration of the so mass-produced epitaxial crystal pieces was determined using a Schottky diode method. The impurity concentration was found to be $1-2 \times 10^{18} cm^{-3}$ at the surface of the crystal piece and $6-10 \times 10^{17} cm^{-3}$ at the inside of the crystal piece. And the profile of impurity concentration was uniform and a good reproducibility was attained.

For comparison, determination was made, in the same method as in this invention, of the impurity concentration of the epitaxial crystal pieces obtained using an appratus whose well for receiving a solution for liquid-phase epitaxial growth is made of a synthetic graphite only. The impurity concentration was found to be $5-10 \times 10^{18} cm^{-3}$ at the surface of the crystal piece and $2-8 \times 10^{18} cm^{-3}$ at the inside of the crystal piece. In this case a high impurity concentration was observed and it was difficult to control the characteristics of the epitaxial crystal piece so as to obtain a predetermined carrier concentration with a good reproducibility.

The following are the characteristics of epitaxial crystals obtained using an apparatus whose well for receiving a solution for liquid-phase epitaxial growth is made of fused quartz only. The impurity concentration was found to be $1-2 \times 10^{18} cm^{-3}$ at the surface of the epitaxial crystal and $2-10 \times 10^{17} cm^{-3}$ at the inside of the epitaxial crystal. As will be clear from the above values a lower impurity concentration can be obtained in this case than in a case where synthetic graphite only is used. However, it was impossible to obtain a predetermined impurity concentration with good repeatability or reproducibility and it was also impossible to obtain a crystal growth layer having a predetermined thickness with good reproducibility. The reason for these is believed to be attributable to a non-uniform distribution of temperature in the epitaxial solution due to the poor thermal conductivity of fused quartz.

Onto an n-type liquid-phase epitaxial growth layer having such characteristics, a p-type liquid-phase epitaxial growth layer was formed. In this case, it is only necessary that a liquid-phase epitaxial growth can be effected, in the same manner as when the n-type epitaxial growth layer is formed, using a p-type epitaxial material introduced into the well.

Use is made of, as a material for a p-type layer, 20g of Ga, 1.4g of GaP and 0.5g of $Ga_2O_3$ and,, as an impurity, 10mg of Zn.

The GaP photoemission diode so obtained represented an enhanced luminous efficiency of 1.5-2% and a good reproducibility.

With the above embodiment, the fused quartz plate 8 disposed under the substrate 9 is unnecessary if the substrate 9 has substantially the same diameter as that of the circular recess 10. That graphite side wall portion exposed within the fused quartz embedded recess 10 of the substrate supporting plate 5 is preferably coated with fused quartz.

With the above embodiment, the substrate supporting plate 5 is slidably moved relative to the apparatus body 1 so as to permit the substrate to substantially align with the bore 2. However, it is needless to say that the apparatus body 1 may be slidably moved relative to the plate 5. Furthermore, the respective well of the apparatus body 1 may be arranged in a circular array, in place of a straight line array, relative to the associated substrate supporting plate 5 to permit one to be rotated relative to the other.

What we claim is:

1. An apparatus for liquid phase epitaxial growth comprising a boat made of synthetic graphite, a first well formed in the upper surface of the boat to receive an epitaxial solution, a second well formed in the upper surface of the boat to receive a substrate and disposed adjacent to said first well, a lower passage extending longitudinally through the boat from one end to the other end and extending across the bottoms of said two wells, a slide made of synthetic graphite moveable through the lower passage so that the top surface of the slide forms the bottom surface of said two wells, the top surface of the slide having a recess in which the substrate is placed, a fused quartz cylinder the outer periphery of which is contacted with the inner surface of said first well, said first well including an annular stop projected on the lower end of the inner periphery to prevent the fused quartz cylinder from falling from said first well, and a fused quartz layer attached to at least that part of the top surface of the slide which forms said bottom surface of said first well when said recess is beneath said second well.

2. An apparatus for liquid phase epitaxial growth according to claim 1 wherein said slide includes another recess in which said fused quartz layer is inserted so that the top surface of said layer is flush with the top surface of said slide.

3. The apparatus of claim 1 wherein said recess in which the substrate is placed includes a fused quartz layer on which the substrate is mounted.

4. The apparatus of claim 1 wherein said boat includes an upper passage extending across the upper portion of said first well and further includes a fused quartz plate slidably inserted in the upper passage to close the first well.

5. The apparatus of claim 1 wherein the thickness of said fused quartz layer is 0.3 to 2mm.

6. The apparatus of claim 1 wherein said second well has a covering made of fused quartz.

7. An apparatus for liquid phase epitaxial growth comprising a boat made of synthetic graphite, a plurality of first cylinderical wells formed in the upper surface of the boat and arranged along the longitudinal axis of the boat so as to receive a large quantity of epitaxial solution for making a plurality of epitaxial layers, at least one cylinderical second well formed in the upper surface of the boat and arranged along the longitudinal axis thereof so as to receive a substrate, the first and second wells being alternatively located, a lower passage extending longitudinally through the boat from one end to the other end and extending across the bottoms of said first and second wells, a slide made of synthetic graphite moveable through said lower passage and having first and second circular recesses formed in the top surface of the slide, a fused quartz cylinder positioned in each first well with the outer peripheral surface thereof in contact with the inner peripheral surface of each first well, said first well including an annular stop projected on the lower end of said inner peripheral surface to prevent said fused quartz cylinder from falling from said first well, a fused quartz disc received in each first recess of the slide, said fused quartz cylinders and discs preventing said epitaxial solution from contacting said synthetic graphite, and a cover plate made of fused quartz inserted into the top part of each first well and positioned substantially parallel with the quartz disc so as to cover the first well.

8. The apparatus of claim 7 which includes a third fused quartz disc mounted on the bottom surface of each second recess.

* * * * *